(12) United States Patent
Lymn

(10) Patent No.: US 9,206,514 B2
(45) Date of Patent: Dec. 8, 2015

(54) LIQUID TREATMENT APPARATUS

(76) Inventor: Peter Philip Andrew Lymn, Waterlooville (GB)

(*) Notice: Subject to any disclaimer, the term of this patent is extended or adjusted under 35 U.S.C. 154(b) by 1277 days.

(21) Appl. No.: 12/522,745

(22) PCT Filed: Jan. 10, 2008

(86) PCT No.: PCT/GB2008/000062
§ 371 (c)(1),
(2), (4) Date: Aug. 6, 2009

(87) PCT Pub. No.: WO2008/084224
PCT Pub. Date: Jul. 17, 2008

(65) Prior Publication Data
US 2010/0200027 A1    Aug. 12, 2010

(30) Foreign Application Priority Data

Jan. 11, 2007 (GB) .................................. 0700527.5
Oct. 29, 2007 (GB) .................................. 0721101.4

(51) Int. Cl.
*C23F 1/08* (2006.01)
*H05K 3/00* (2006.01)
*H05K 3/06* (2006.01)
*H05K 3/22* (2006.01)

(52) U.S. Cl.
CPC ................ *C23F 1/08* (2013.01); *H05K 3/0085* (2013.01); *H05K 3/068* (2013.01); *H05K 3/227* (2013.01); *H05K 2203/0746* (2013.01); *H05K 2203/1509* (2013.01)

(58) Field of Classification Search
CPC ........................................................ B08B 3/04
USPC ................................................. 134/15, 122 R
See application file for complete search history.

(56) References Cited

U.S. PATENT DOCUMENTS

| | | | |
|---|---|---|---|
| 2,926,674 A * | 3/1960 | Umbricht et al. ................ | 134/72 |
| 4,015,706 A * | 4/1977 | Goffredo et al. .............. | 198/583 |
| 4,305,765 A * | 12/1981 | Wilmotte et al. ................ | 134/15 |
| 4,475,259 A * | 10/1984 | Ishii et al. ........................ | 15/102 |
| 4,789,405 A * | 12/1988 | Blasing et al. ..................... | 134/1 |
| 4,808,427 A * | 2/1989 | Melvin .......................... | 426/521 |
| 5,111,960 A | 5/1992 | Zilliox | |
| 5,346,070 A | 9/1994 | McSpadden | |
| 5,429,231 A | 7/1995 | McSpadden | |
| 5,614,264 A * | 3/1997 | Himes ............................ | 427/424 |
| 5,697,512 A | 12/1997 | Brickley | |

(Continued)

FOREIGN PATENT DOCUMENTS

AU      746 118 B2     4/2002
DE      EP 0 399-325   11/1900

(Continued)

*Primary Examiner* — David Cormier
(74) *Attorney, Agent, or Firm* — Jennifer Meredith, Esq.; Meredith & Keyhani, PLLC

(57) ABSTRACT

Treatment apparatus has up-stream rollers 2 and down-stream rollers 3. Between the rollers are provided a pair of upper and lower treatment zone plates 4,5, spaced by a gap 6 through which sheet material to be treated can be passed. The plates have grooves 9 occupied by strips defining up- and down-stream even slots 14,15 for flow of treatment liquid into the gap 6.

The ends of the upper plate 4 are smoothly rounded at 37. When sheet material is fed into the gap flow occurs on top of the sheet and up over the rounded edge of the plate. Then it flows sideways off the top of the plate without flowing over the top of the upper rollers.

33 Claims, 18 Drawing Sheets

(56) References Cited

U.S. PATENT DOCUMENTS

| | | | |
|---|---|---|---|
| 5,904,773 A * | 5/1999 | Himes | 118/314 |
| 5,960,982 A | 10/1999 | Perlis | |
| 5,971,139 A | 10/1999 | Bradley | |
| 6,021,790 A * | 2/2000 | Yoshitani et al. | 134/62 |
| 6,264,026 B1 | 7/2001 | Bradley | |
| 2006/0102213 A1* | 5/2006 | Kopp et al. | 134/198 |
| 2008/0142515 A1 | 6/2008 | Phifer | |

FOREIGN PATENT DOCUMENTS

| | | |
|---|---|---|
| DE | 26 11 132 | 9/1977 |
| DE | EP 0 212253 A | 3/1987 |
| DE | WO 2005/038369 | 4/2004 |
| EP | 0 578 040 | 1/1994 |
| EP | 0 748 150 | 12/1996 |
| EP | 0 954 385 | 6/2004 |
| GB | 2 197 581 | 5/1988 |
| JP | EP 0 130 866 | 1/1985 |

* cited by examiner

LIQUID TREATMENT APPARATUS

The present invention relates to apparatus for treatment of sheet material with liquid, in particular for treating the sheet material with chemicals and/or for washing such the chemicals from the sheet material.

The printed circuit boards, also known as substrates, for carrying electronic components are made in a variety of form from single layer flexible sheets to multi-layer rigid sheets. They share the requirement to be treated and/or washed during their preparation to receive their components.

European patent No 0,578,040 in the IBM name describes and claims in its main claim fluid treatment apparatus, comprising:
  at least a first surface, of finite dimensions, including an entrance edge and an exit edge and having an axis extending from said entrance edge to said exit edge;
  means for transporting a substrate over said surface at a distance H, from said surface, from said entrance edge to said exit edge along a direction which substantially parallel to said axis, characterised in that
  said apparatus further comprises at least a first row of at least two, spaced-apart fluid jet injectors, said first row being aligned transversely to said axis, said at least two fluid jet injectors penetrating said surface and serving to produce a first row of at least two fluid jets which impinge upon said substrate, characterised in that each of said fluid jet injectors being positioned closer to said entrance edge than to said exit edge, whereby after said first row of fluid jets is impinged upon said substrate, more than half the fluid associated with said first row of jets flows in a direction substantially opposite to the direction of transport of said substrate.

This IBM proposal is particularly concerned with the problem of "dragout", namely adequate treatment of awkward features, such as holes in boards being treated. The solution is that advocated in the claim quoted above, namely placing the fluid jet injectors closer to the entrance edge and biasing the flow from the injectors towards this edge. Whilst allowing the flow to pass quickly out at the entrance edge has advantage in terms of "dragout", it has been found that this apparatus is not particularly effective in treatment of the substrate with the liquid.

The object of the present invention is to provide improved apparatus for treating a substrate or sheet material with a liquid.

According to the invention there is provided an apparatus for the liquid treatment of sheet material passing through the apparatus, the apparatus comprising:
  upper and lower path defining plates, the plates being separated by a gap between opposed faces of the plates to provide a treatment zone, the gap and the plates having:
    width transverse to a length of a generally horizontal sheet path between the plates and
    length along the sheet path from up-stream edges of the plates to their down-stream edges;
  edge closures of the gap at the edges of the plates, at least substantially along the length of the sheet path within the plates and delimiting the width of the gap;
  means for transporting a sheet to and from the gap, in a transport direction giving sense to the terms up- and down-stream as used herein, and including:
    pairs of upper and lower in-feed and out-feed rollers at respective up- and down-stream edges of the plates;
  means for injecting treatment liquid to the gap intermediate its up- and down-stream ends for flow in the gap both up- and down-stream of the transport direction and including:
    at least one respective transverse nozzle means in each of the plates at their opposed faces and
    means for pumping liquid to each nozzle means to fill the gap both up- and down-stream from the nozzle means to their up- and down-stream edges in normal use;
  wherein the treatment zone in the gap between the plates has:
    an up-stream portion up-stream of the nozzle means and
    a down-stream portion down-stream of the nozzle means,
      the two portions being substantially equal in their respective lengths from the upstream edge of the plates to the nozzle means and from the nozzle means to the downstream edge of the plates, whereby the liquid flows substantially equally to both edges and the sheet material is exposed to the liquid for treatment substantially equally in both portions.

By providing equal up- and down-stream portions, I have found that improved treatment is possible. For instance, I have been able to plate silver electrolessly onto the tracks of a printed circuit board. I believe that this is practical as a result of the flow being steady on the upper and lower sides of the board, with the board passing at steadily and being between the plates long enough for the treatment to occur. I have been surprised to achieve good results over a wide range of conditions, which I attribute to the existence of movement between the boards and the treatment liquid in both the up-stream and the down-stream portions. I would expect the limits of satisfactory operation to be when either the slot to plate edge distance is reduced to below 25 mm, although I have found a series of short plates to be effective in place a single plates of the same aggregate length, or the speed of the board in the downstream portion approaches that of the liquid flowing with it.

Whilst the nozzle means can be rows of bores as in the IBM proposal, in the preferred embodiment, the nozzle means are slots in the plates.

Whilst single slots in the path defining plates may be provided, in the preferred embodiment, two slots are provided in each of the two plates. They can be provided exactly opposite each other. However for enhancing treatment liquid flow through apertures in the sheet material, the slots are preferably arranged to be staggered from one plate to the other. The slots can be envisaged to be provided with a component of direction such that the up-stream one points up-stream and the down-stream downstream. Again in the preferred embodiment, they are all directed normally to their plates.

As mentioned, the slots are preferably staggered from one plate to the other. This implies that they are nearer one edge of the plates than the other. However, whilst this variation is small in comparison the distance from the up- and down-stream edges of the plates, leaving the up- and down-stream portions of the treatment zone remain substantially equal. In particular, where two slots are provided in each plate and the mid-point of the plates falls with the two slots, then the two portions can be expected to be substantially equal.

In accordance with a particularly preferred feature, the liquid treatment apparatus includes:
  rounded edges of the upper plate at its respective up- and down-stream edges, the rounding of the edges providing a smooth flow contour for liquid onto the top of the top plate at its ends in the presence of sheet material between both the plates and either of the in-feed or out-feed rollers, the sheet material damming flow of liquid on top of the sheet material from passing between the lower roller and the lower plate; and a flow path from the top of the upper plate to a drain.

It should be noted that the sheet material transport direction is contrary to the liquid flow direction in the up-stream portion of the gap and in the same direction as the liquid flow direction the down-stream portion.

Whilst single slots in the path defining plates may be provided, in the preferred embodiment, two slots are provided in each of the two plates. They can be provided exactly opposite each other. However for enhancing treatment liquid flow through apertures in the sheet material, the slots are preferably arranged to be staggered from one plate to the other. The slots can be envisaged to be provided with a component of direction such that the up-stream one points up-stream and the down-stream downstream. Again in the preferred embodiment, they are all directed normally to their plates.

The slots can be provided as a machining from one side of the plate to the other. However, in the preferred embodiment, the slots are configured as a groove in the plates in their faces opposite each other, with a strip let in to define the slots as the clearance between the strip and the groove. Each strip is supported centrally to a remaining piece of the plate. To provide flow passages to the slots, a series of drillings is provided through the plate. A plenum chamber is preferably provided to feed the drillings.

To assist flow in passing between the edges of the lower plates and the lower ones of the in-feed and out-feed rollers, these edges are preferably castellated.

To help understanding of the invention, two specific embodiments thereof will now be described by way of example and with reference to the accompanying drawings, in which.

Figure 1:
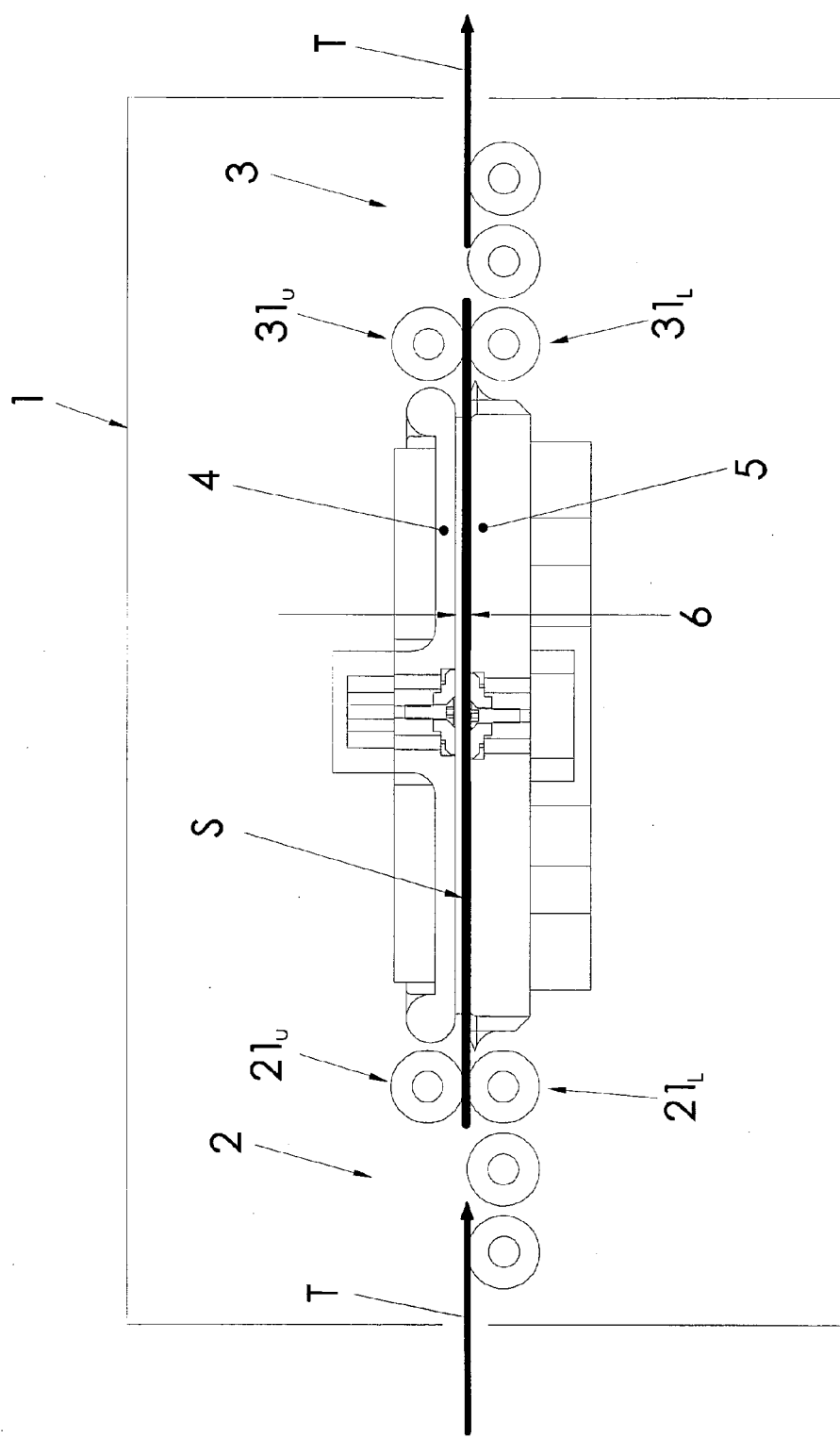
FIG. 1 is a diagrammatic side view of liquid treatment apparatus of the invention.
Figure 2:
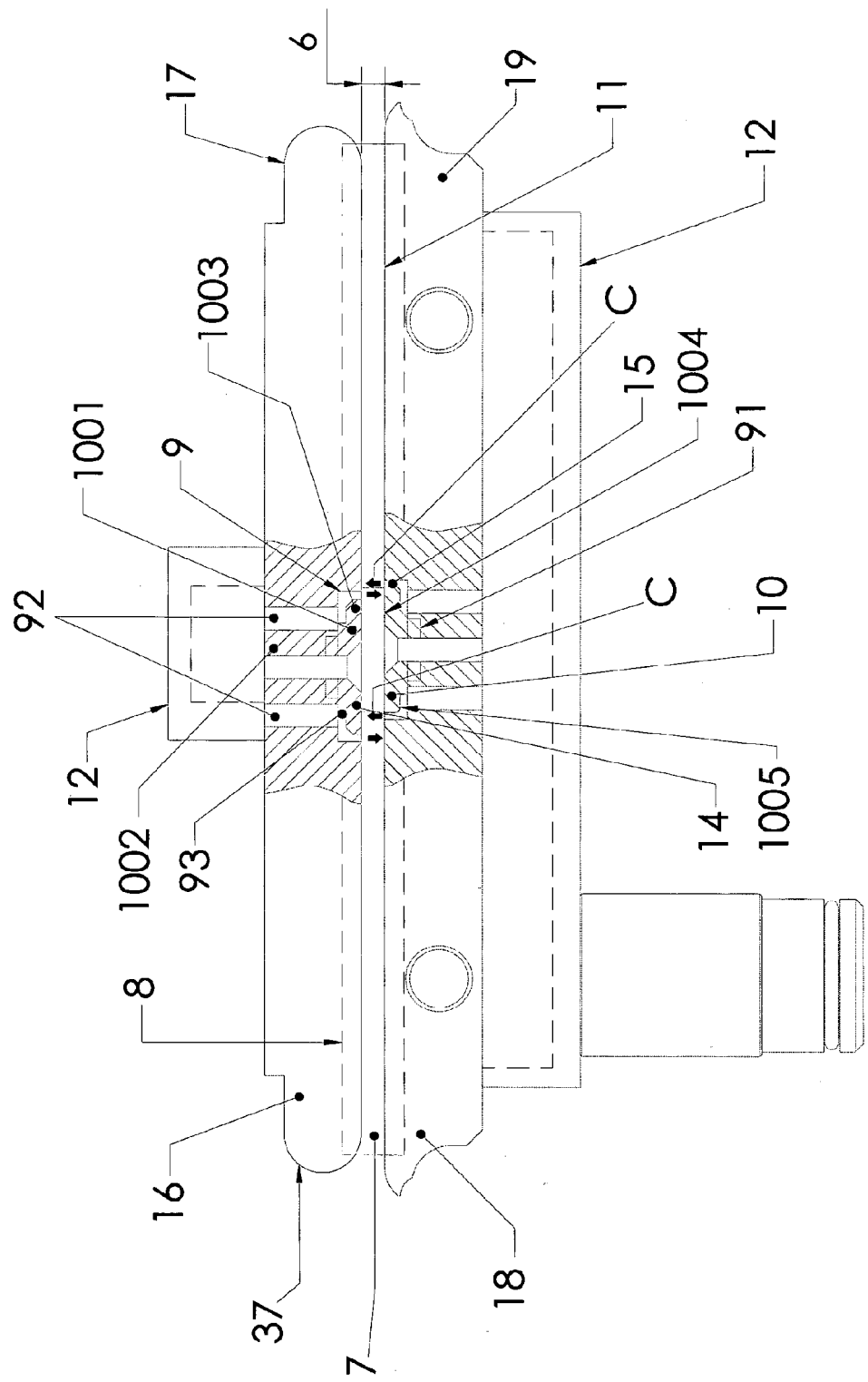
FIG. 2 is a partially sectioned side view of a pair of upper and lower treatment zone plates in the apparatus.
Figure 3:
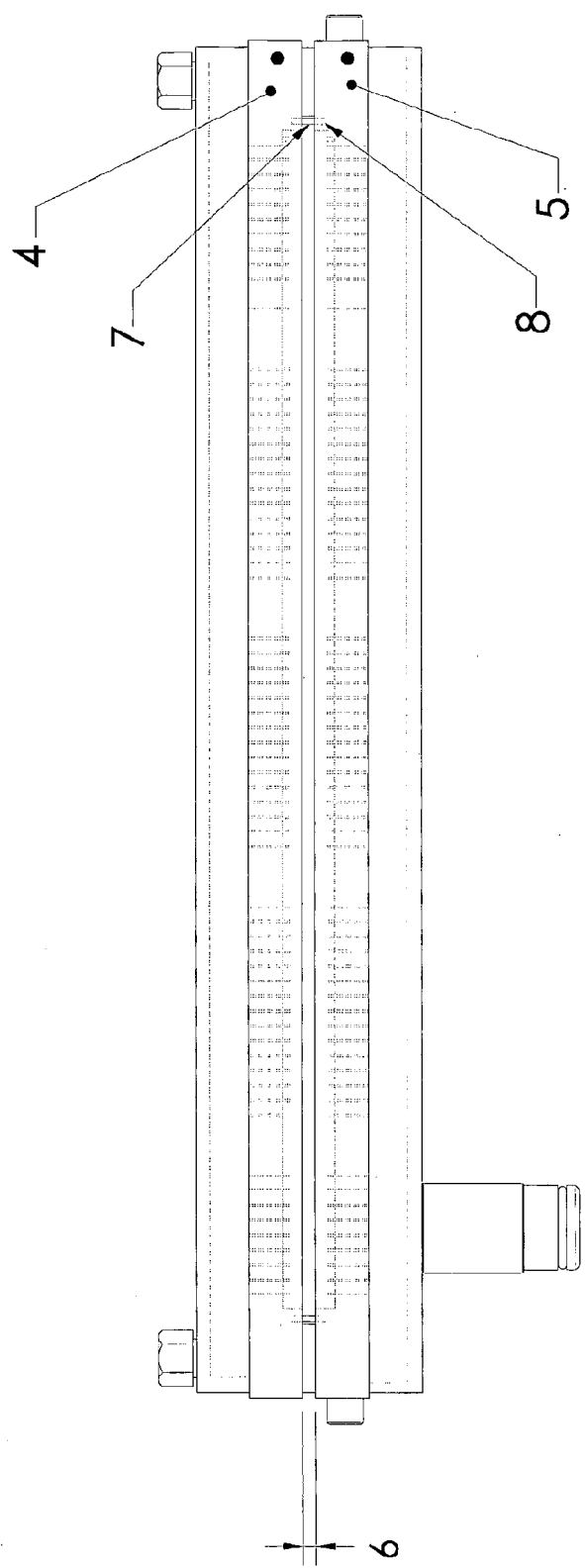
FIG. 3 is an end view of the plates.
Figure 4:
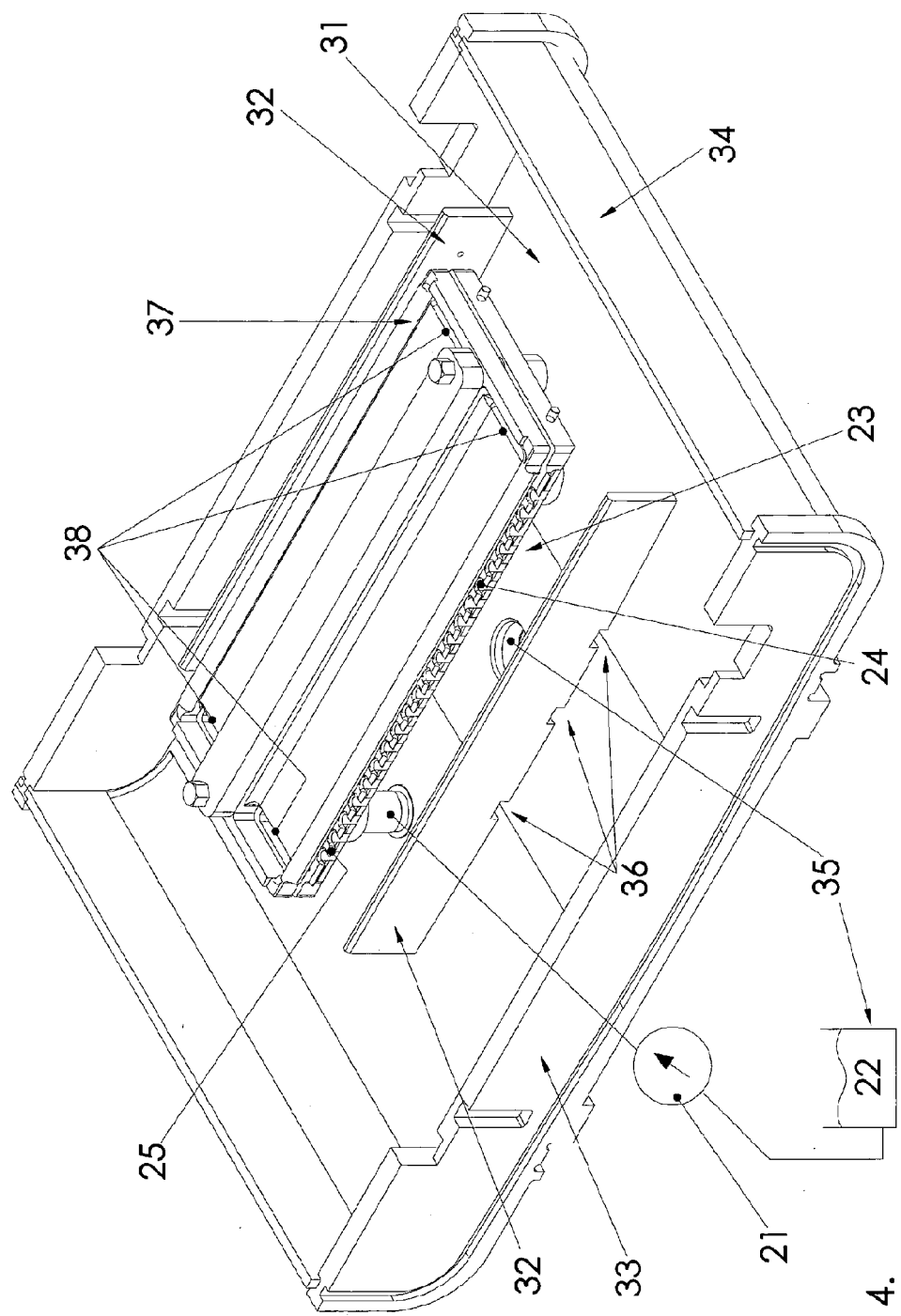
FIG. 4 is a perspective view of the plates and a liquid collection tray underneath it.
Figure 5:
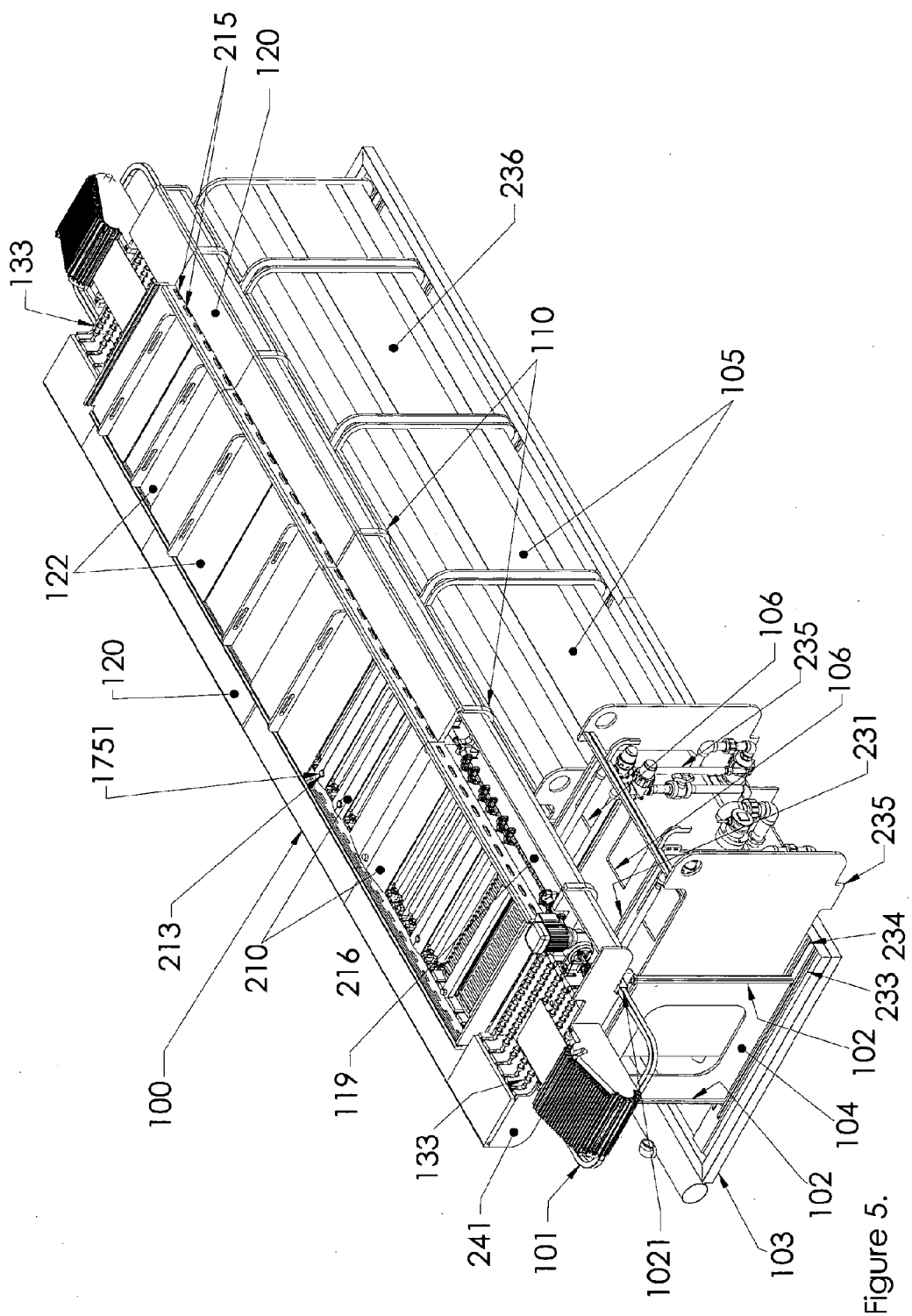
FIG. 5 is a perspective view of a treatment line or machine in accordance with the invention.
Figure 6:
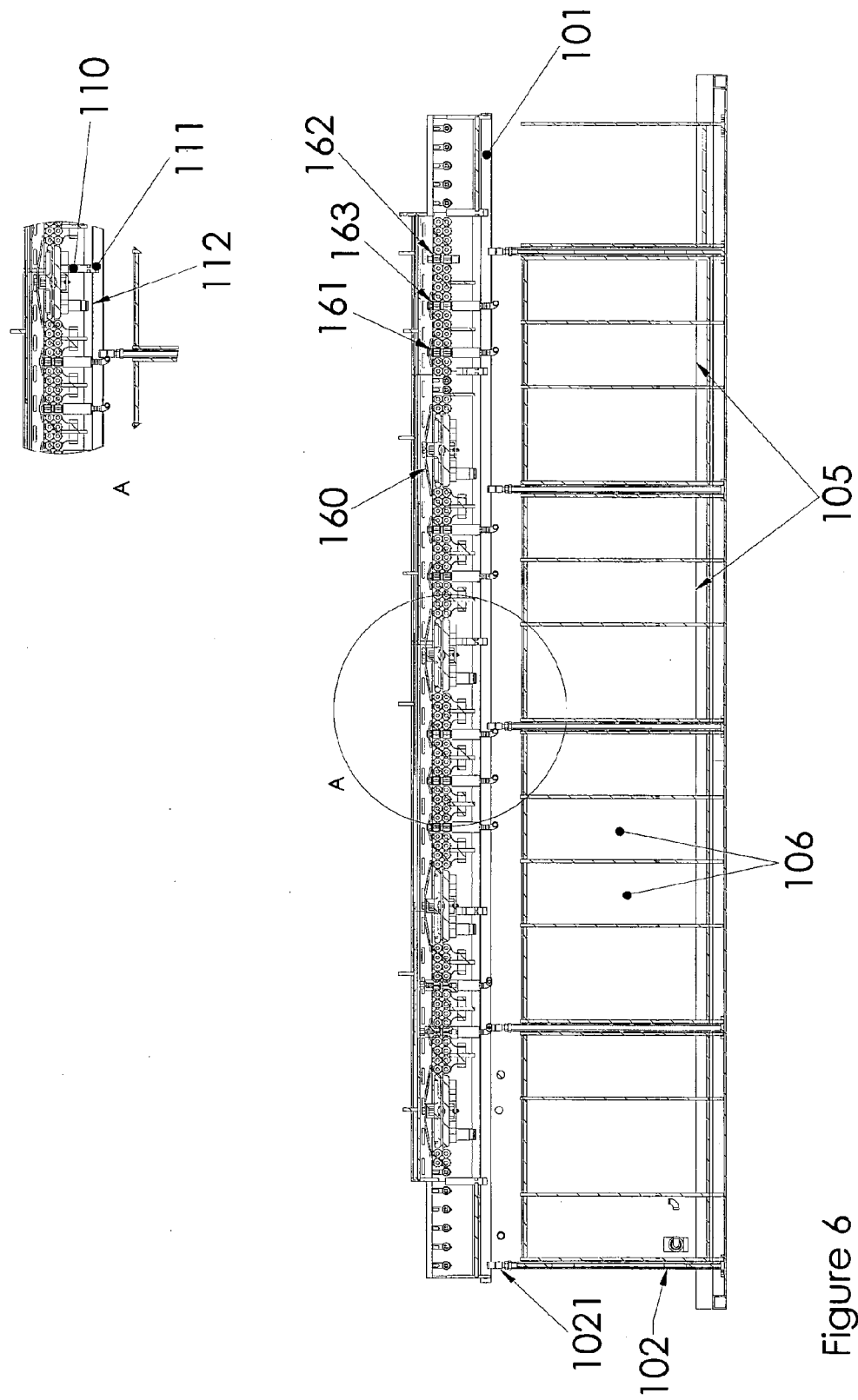
FIG. 6 is a side view of the machine of FIG. 5.
Figure 7:
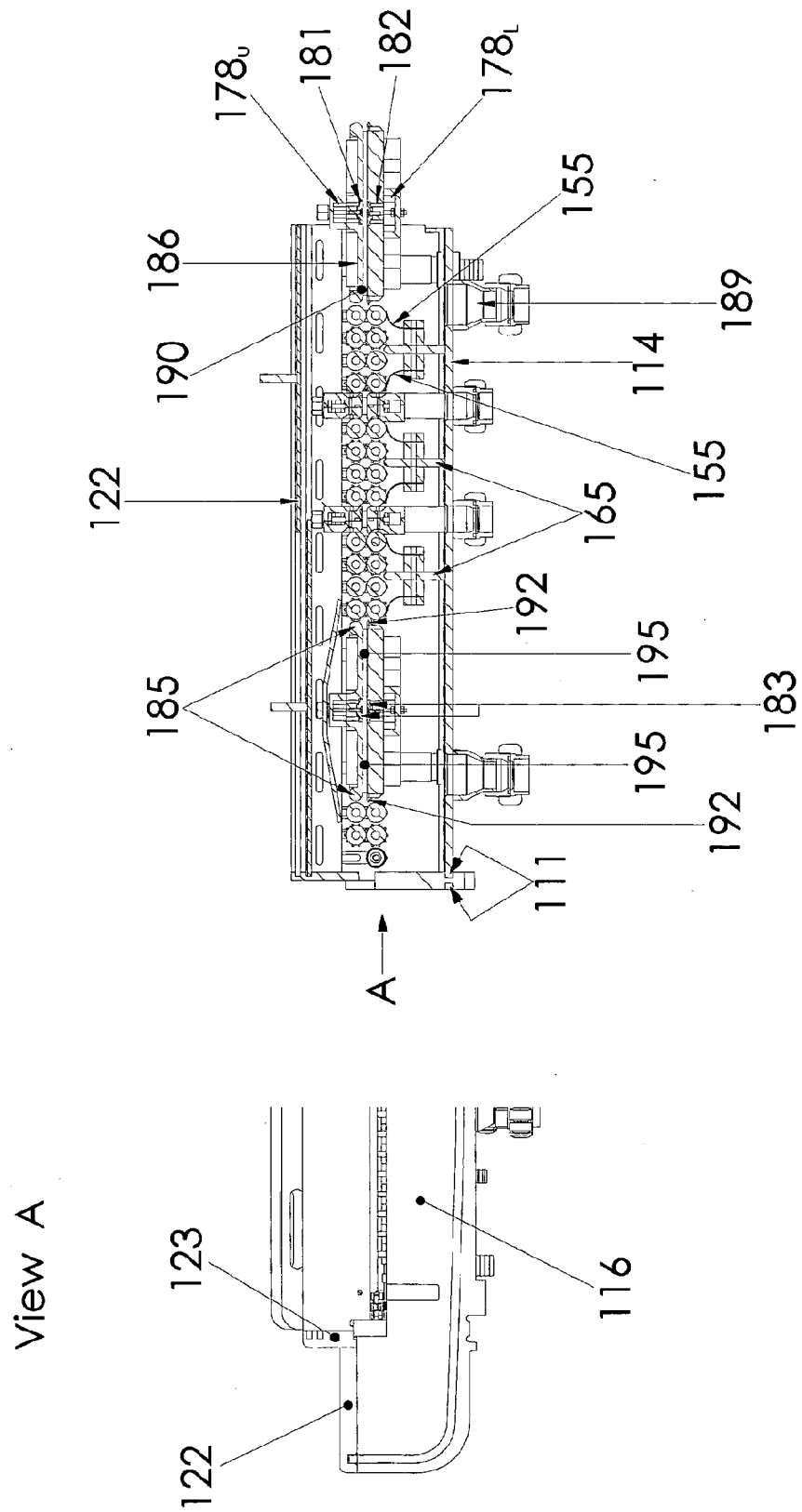
FIG. 7 is an oblique view of a cross-section of part of the machine of FIG. 5.
Figure 8:
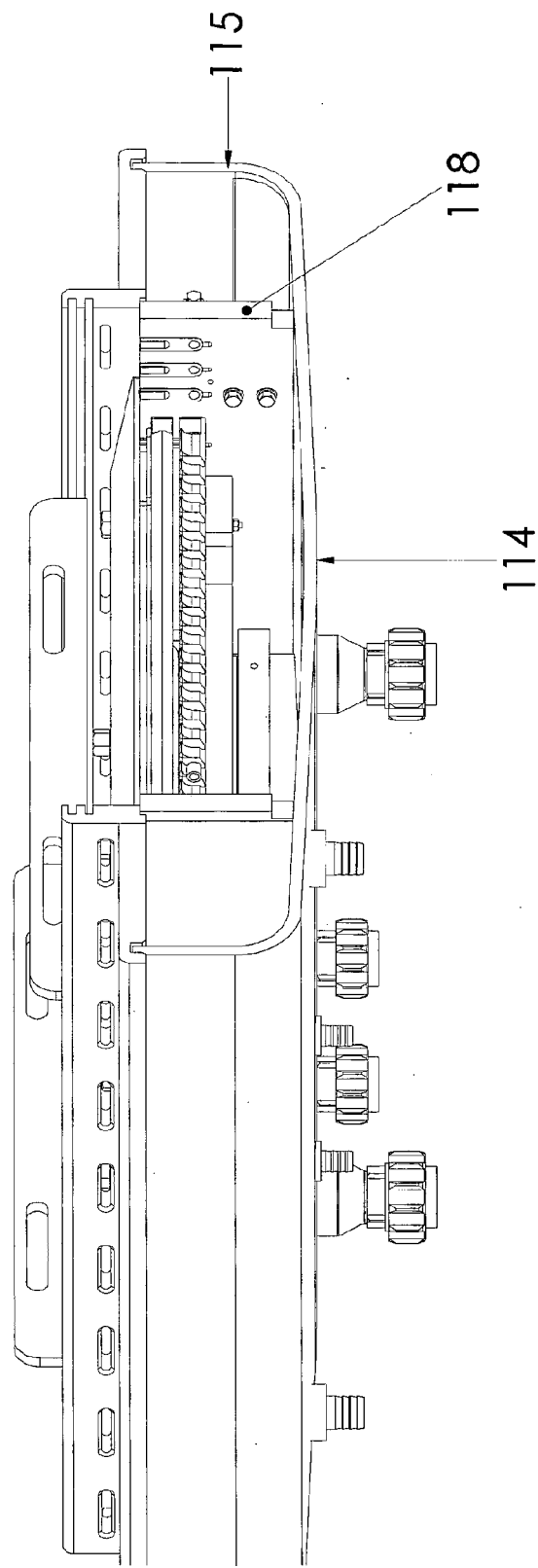
FIG. 8 is an oblique view similar to FIG. 7, but from the other direction.
Figure 9:
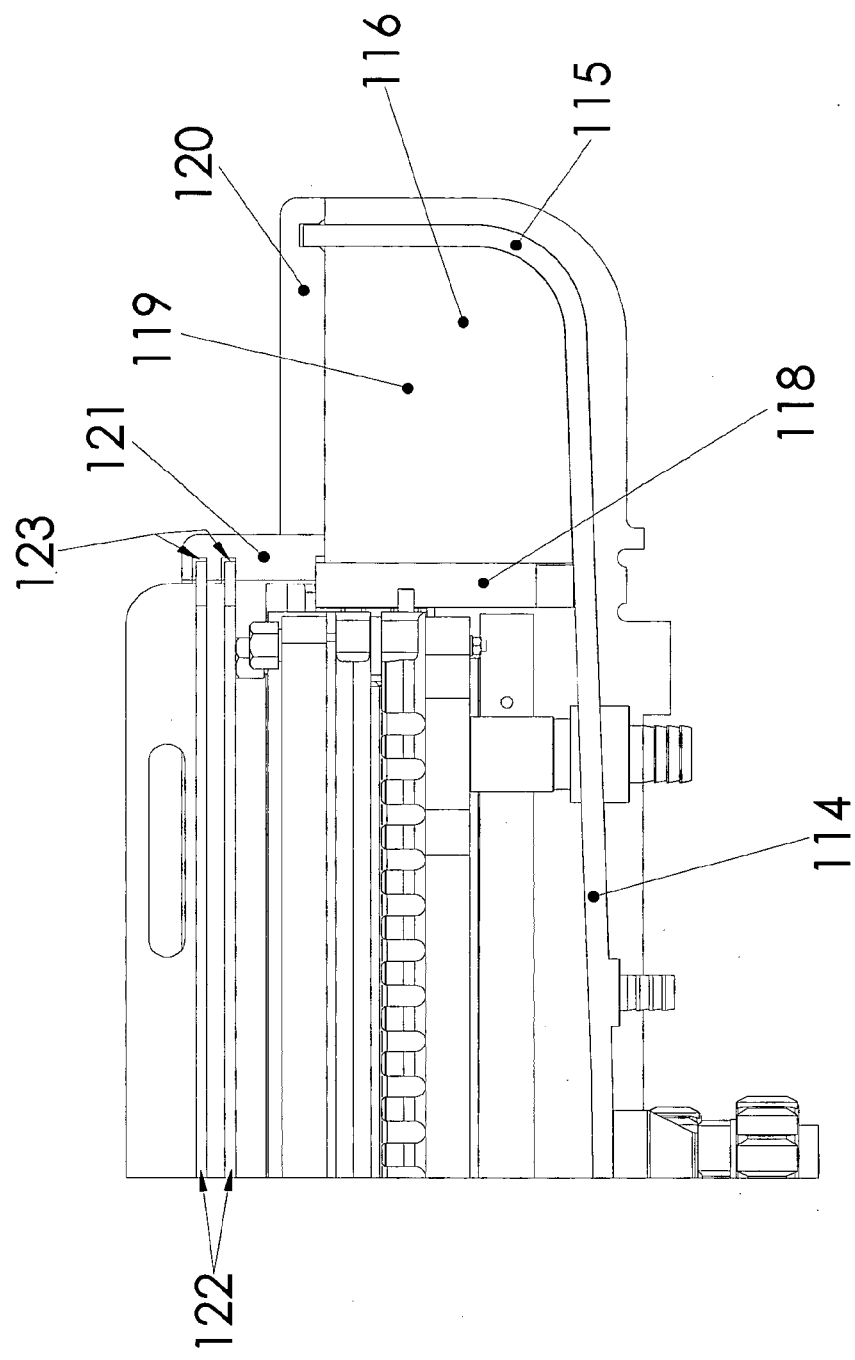
FIG. 9 is an end view of the part of the machine of FIG. 7.

Referring to FIGS. 1 to 4 of the drawings, the chemical treatment apparatus thereshown comprises a cabinet 1, in which are mounted up-stream rollers 2 and down-stream rollers 3. Both sets comprise a one sided conveyor and both comprise a nip pair, of in-feed rollers $2_u,21_l$ and of out-feed rollers $31_u,31_l$. The rollers are ganged together in conventional manner for drive by a motor not shown in a transport direction T. Between the in-feed and out-feed rollers are provided a pair of upper and lower treatment zone plates 4,5, between which sheet material to be treated can be passed. The nips of the rollers are spaced by just less than the length of the shortest sheet S to be processed to provide for continuous drive of sheets between the plates. These are rigid plates, suitably of stainless steel or rigid plastics material according to the sheet material, treatment chemical and treatment temperatures involved. The plates are separated by a gap 6, which provides a treatment zone extending the length plates. The gap (and the treatment zone) is bounded on its side edges by strips 7, let into grooves 8 in the plates and determining the height of the gap.

Substantially midway along the gap, between the rollers is a transverse groove 9 in each plate. The groove is of predetermined width and stepped, with a central, deeper groove 91. A series of drillings 92 penetrate the plates at lands 93 defining the depth of the wider part of the groove. Each groove 9 is largely filled by a T-section strip 10 of having a ridge 1001 forming the foot of the T and locating in the deeper groove and secured there by screws 1002. The head 1003 of the T has a face 1004 co-planar with the surrounding face 11 of the plate having the groove. The edges 1005 of the head 1003 define up- and down-stream even slots 14,15 for flow of treatment liquid into the gap 6. Under the head 1003, sufficient clearance is left for liquid from the drillings 92 to reach the slots. These have square sides for flow to be normal to the plate face 11. Flow to the drillings is from plenum chambers 12 constructed on the outer faces of the plates.

Whilst the grooves 9 are substantially midway between the up- and down-stream edges 16,17; 18,19 of the upper and lower plates, they are offset by half their width, whereby their slots are not exactly opposite each other. Thus flow of liquid from the slots, in the form of curtains C do not impinge directly on each other, but interdigitate. Thus sheet material passing between the plates and having holes in it, will experience flow directed first from one side and then the other as it passes the slots.

In the absence of sheet material, a pump 21 pumps liquid from a reservoir 22 to the plenum chambers. It is pumped at a rate to completely fill the inter-plate gap and floods through castellations 23 in end portions 24 of the lower plate 5 and lower ones of the in-feed rollers $21_u,21_l$ and of out-feed rollers $31_u,31_l$. The fingers 25 of the castellations support sheet material passing into the treatment gap when first fed to it.

Beneath the plates and the in-feed and out-feed rollers is a liquid collection tray 31, having a shallow V configuration, with inner and outer walls 32,33 in the up-/down-stream direction and plain side walls 34. It has a drain 35 to the reservoir 22. The inner walls have small drillings 36 to allow liquid to drain through. The main purpose of the inner walls is to contain most of the splashing from the liquid flow whilst the outer walls catch any exceptional splashes, drips from rollers etc. The in-feed and out-feed rollers are within the extent of the inner walls and the last/first of the other feed-in conveyor rollers/feed-out conveyor rollers are within the extent of the outer walls.

The ends of the upper plate 4 are smoothly rounded at 37. When sheet material is first fed into the gap or first emerges from it, flow that was down through the castellations is diverted up. In order to avoid the need for the tray to 31 be one set of rollers longer in both directions and to generally maintain the equipment compact, it is desirable for the liquid not to overflow the upper ones of the in-feed rollers $21_u, 21_l$ and of out-feed rollers $31_u, 31_l$. It has be surprisingly found that the rounding 37 has a marked effect in reducing the tendency for the liquid to overflow the rollers. This is believed to result from the Coanda effect. It should be noted that the liquid does not flow up without the dam assistance of the upper rollers. However it can be said that a high flow through the apparatus is possible with the rounded ends. It should be noted that the flow through the slots 14,15 is higher than that achieved in the prior art for the same plate area. This is attributable to the enhanced flow cross-section of the slots.

This enhanced flow allows a faster exchange of reagent or solvent in contact with the sheet material and hence enhanced chemical reactions etc.

Once the liquid has flowed up onto the top plate, it flows off sides ways at 38. No liquid is flowing sideways from between the plates, because of the side strips 7.

The slits 14, 15 in the respective upper and lower plates are off set slightly, whereby treatment liquid exiting the slits can flow through apertures (not shown) in the sheet S therebetween without flow from an immediately opposite slit hindering such flow. Aside from such off-set, the slots 14,15 are generally midway between the up- and down-stream rollers.

The treatment liquid may have gas entrained, such as oxygen, with it either as bubbles added to the liquid flow immediately before the flow reaches the plenum chambers, or indeed as dissolved gas.

Further, the upper plates can be thicker at the rounded edges 37 than their general thickness, including their thickness at the edges 38, whereby liquid welling up over the edges 37 is directed to flow off the plates at the edges 38.

Referring onto to FIGS. 5 to 20, there is a shown a chemical treatment line or machine 100. It has a pair of elevated chassis rails 101 supported on legs 102 from a base plate 103. The rails and legs are of steel, whilst most other components are of plastics material typically polypropylene. In the following description, it should be assumed that this material is used, except where otherwise specified or clearly not suitable as for shafts.

The rails run the full length of the machine. The legs are provided periodically whereby the rails do not need to be heavy, typically being of 50 mm square, stainless steel tube. The legs are of the same material and are fixed to the base and the rails with height adjustment clamps 1021 so as to provide stability to the structure. This is enhanced laterally of the rails by panels 104 fitted between respective pairs of legs at the same position along the length of the rails. The panels define tank bays 105, which are occupied by treatment liquid tanks 106 and which fit the panels and legs sufficiently closely to provide stability longitudinally of the rails. Thus the rails provide a stable platform for the board transport and treatment apparatus mounted on the rails. In particular, the apparatus is likely to be subjected to differing temperatures at different points along its length, whereby some parts expand and contract differentially between use and downtime. The rails, in supporting the apparatus independently of the tanks 106, isolate the tanks from such thermal stresses. The tanks themselves may expand and contract differentially with change of temperature of processing liquid contained and often heated in them. A particular advantage of isolating the structure of the treatment apparatus is that the constraint of having similar temperatures in the tanks and the portion of the apparatus above is removed. This allows for instance all the hot tanks to be at one end and the cold tanks to be at the other, whereas usage of the hot and cold liquid alternates along the apparatus. This is made easier by using flexible hose connections from the tanks to the apparatus.

A plurality of shallow-U ribs 110 are supported on the rails. These have lateral grooves 111, in which similarly shaped shells 112, which are long in the direction of the rails, are located and welded in position. The shells have a floor 114 and walls 115. At appropriate positions, according to whether a cross-wall 116 is required between the shells, the ribs are continuous between their upright limbs 117. Such a cross-wall is provided at each end of the apparatus. Parallel to the shell walls 115 internal parallel inner walls 118 are provided. These are located in the ribs and welded to the shells. They provide direct support for the components described below for transporting boards and treating them. Between the shell walls and the inner walls, channels 119 are provided along both sides of the apparatus. Lids 120 are provided over the channels resting on the respective walls. Wall extensions 121 are fitted to the lids at their inner edges and in effect raise the height of the inner walls. Sliding covers 122 extend between the wall extensions, being located in inwards-facing grooves 123 in the wall extensions.

For board transport, a drive motor and gearbox 130 is provided at the infeed end of the apparatus, being mounted at the end of the one of the channels to drive via bevel gearing a roller drive shaft 131 extending the full length of the apparatus in one of the channels 119. It is provided with bevel gears 132 for driving transport rollers 133, 134. These comprise single infeed and outfeed rollers 133, whose arrangement is the same as the lower ones of the intermediate transport rollers 134. The latter are provided in pairs. They are mounted in bearings 135, accommodated in open topped upright grooves 136 in the side walls. Certain of the grooves are closed on their channel sides. Others extend through the inner walls and have slots 137 in their bottom directing any liquid running down the grooves to the inside of the inner walls. Additionally the grooves have slots 138 on either side extending in the direction of the inner walls. Where the grooves do extend through the walls, their outer width 139 is narrower than their inner width 140. The bearings are shaped complementarily to the grooves as regards the slots 138 and the inner width, being formed as a block with rebates 141. They leave a space 142 when fitted on their outside down which any leakage of liquid can pass to the slots 137. In their inside faces, the bearings have bearing grooves 143 for shafts 144 of upper ones of the transport rollers. These grooves are open at the top to allow the upper rollers to rise with board passage for lifting out of them for cleaning. Below the bottom of the grooves, the bearings usually have bores 145 for the shafts 146 of the lower rollers. The lower rollers can be lifted out for cleaning together with their bearings.

Certain of the shafts of the lower rollers are longer and pass through the bores which are open. Bevel gears 147 are carried on these shafts and engage with the bevel gears 132. The result is that certain lower rollers are driven. These have first pinions 1471 inside the inner walls for meshing with pinions 148 on the shafts of upper ones of the pairs of rollers. The result is that these pairs of rollers are positively driven for board transport. Closer to the inner walls than the first pinions 1471, the driven lower rollers also carry pinions 149, which mesh with idlers 150, meshing with further pinions 149 on the other lower shafts. At the opposite ends of these lower shafts, they carry extra pinions 151 in mesh with the pinions 152 on the upper shafts. Thus all the rollers, both upper and lower are positively driven. Normally, both the upper and the lower rollers are plain, although infeed and outfeed conveyor rollers at the end of the machine can be castellated 154. Wipers 155 are provided for wiping liquid from lower rollers immediately adjacent a treatment head in the interests of board height and drive steadiness.

The intermediate rollers 134 are arranged between fluid treatment heads of various types, of which the primary one 160 is for chemical treatment of the boards. Other washing 161 and drying 162 and lacquering 163 heads are provided. Each head is provided at a bay 164 defined between the inner walls, defined by two dividers 165 extending between the inner walls. The dividers are lower than the inner walls and are provided to avoid treatment liquid of one bay mixing with that of an adjacent one. Where there is a conveniently positioned rib 110 it may perform the function of a divider. Otherwise, separate dividers can be welded onto the shells. The dividers support the wipers 155. Usually each bay will have its treatment head midway between its dividers with two pairs of rollers upstream and two down stream.

The primary treatment head 160 will now be described with reference to FIGS. 7, 10, 18 & 19. It should be noted that it is similar to that of the apparatus of FIGS. 1 to 4. It has a pair of plates 171,172, which have marginal grooves 173 for edge spacers 174. Threaded rods 175 are fast in the lower plate and pass through the upper plate for securing nuts 1751 to hold the two plates firmly together, with a gap between them being determined by the depth of the grooves 173 and the height of the spacers 174. The lower plate has spigots 1721 positioned to engage in inner wall grooves 136 between the bay's rollers, such that the gap between the plates is level with the nip of the rollers. The lower plate has a liquid inlet 176, with an O-ring seal, for engaging in a socket 177 in the floor 114 of the bay. Feed of treatment liquid to the inlet 176 will be described further below. From the inlet, the liquid flows to upper and lower plenums $178_u$, $178_l$. It reaches the upper plenum via ports 179 in which the rods 175 are centred, with a sealing sleeve 180 interconnecting the ports. Centrally in the plates in board path direction and transversely thereof are grooves 181 communicating with the plenums via a series of drillings 182. A strip 183 mostly fills the orifices of the grooves, leaving narrow slots 184 at the up- and down-stream edges to the grooves. These gaps are offset in the board path direction between the upper and lower plates.

The upper plate has curved up- and down-stream edges 185 with shallow wells 186 in its upper surface, into which treatment fluid welling up over the edges flows. It drains from the wells via side slots 187, positioned outside the grooves and spacers 173,174. Matching slots 188 in the lower plates allow the liquid to flow back to the floor of the bay and thence to a central drain 189. Up- and down-stream of its narrow slots 184, the under-surface 190 of upper plate is plain and plane.

The lower plate has fingers 191 machined in its up- and down-stream edges 192. These extend to the edges of the upper plate and have slightly chamfered ends 193. The spaces between the fingers provide flow passages 194 for liquid from the flow gaps 195 between the plates, when no board is present. This arrangement guides flexible boards positively between the plates without interference from the liquid flow. Once a board is past the ends of the flow passages 194, the flow might be all on top and force the board against the lower plate. To avoid this, the lower plate is provided with shallow, tapering outwards runnels 196 which determine that some of the treatment liquid will definitely flow under the board until its leading edge has reached the slots 184, whereupon the flow above and below is definitely provided for by it being fed to both sides of the board. Taper of the runnels ensures that progressively less fluid passes under the board as the leading edge of the board approaches the ends of the runnels. In the interest of the treatment head being symmetrical, the runnels are provided in the lower plate on both sides of the slots 184.

In use, a board is transported to the upstream edge of the plates. As it passes into the space or flow gap 195 between them, the treatment liquid flowing from the upstream slots 184 divides with some flowing below the board and some flowing onto the top side of the board. As this latter flow exits the plates at the curved edge 185, it is inhibited from flowing in the direction whence the board has come by the nearest transport roller. It then flows smoothly up the curved edge and onto the top of the top plate. The curvature of the edge encourages this flow to be laminar, which is of advantage in promoting uniformity of treatment. From the well 186, the upper flow drains off sideways through the slots 187,188. Once the board reaches the slots 184, the flow to top and bottom of the board is positively established. The liquid flow speed in the direction of and against the board direction is fast in inverse proportion to the separation of the plates. Thus in the flow gap 195, which provides a treatment zone, products of chemical reaction between the board and the treatment liquid are quickly carried away, with little risk of the reaction being stiffled for want of fresh reagent.

Figure 10:
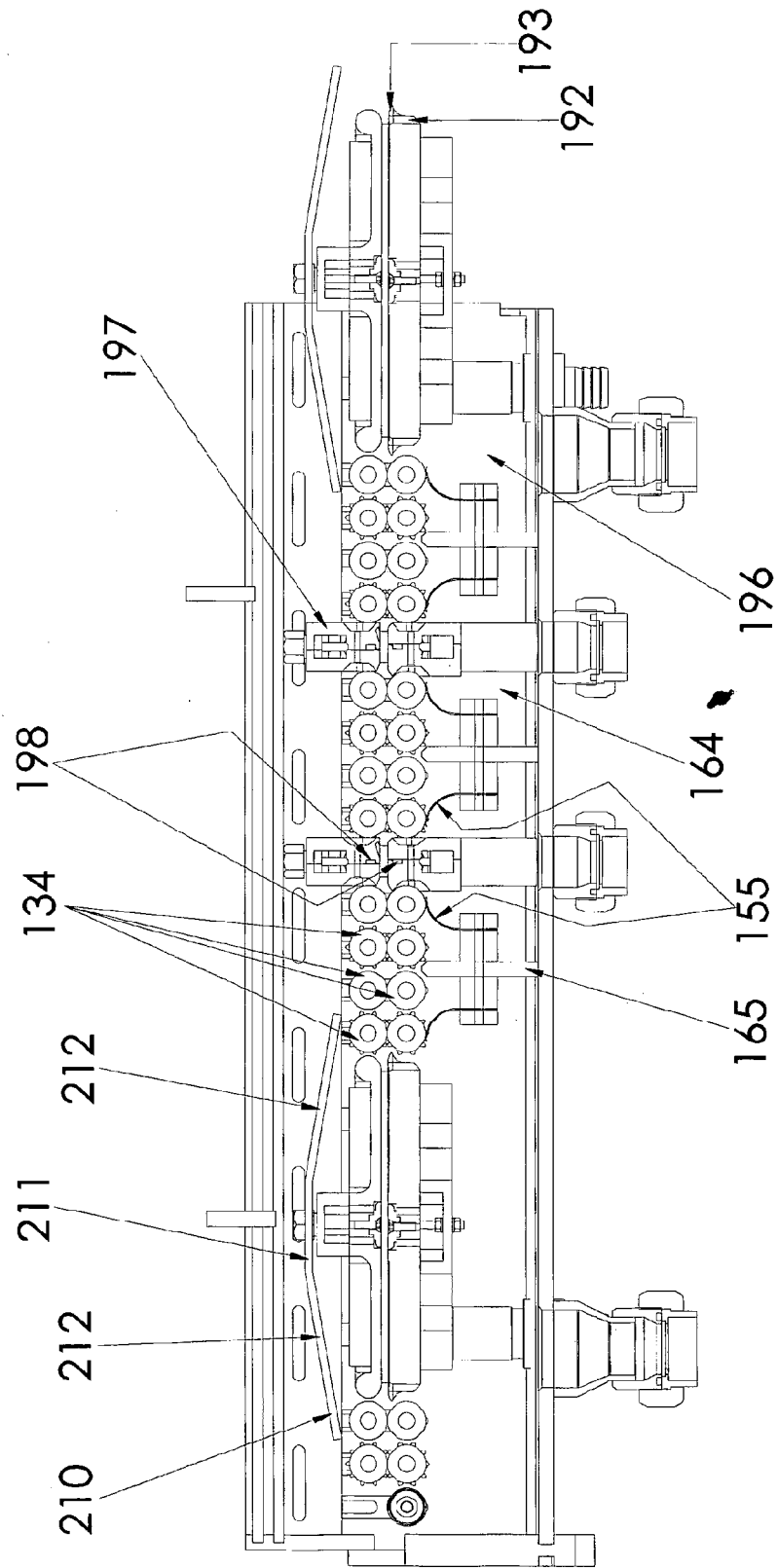
FIG. 10 is a cross-sectional side view of the part of the machine of FIG. 7.
Figure 11:
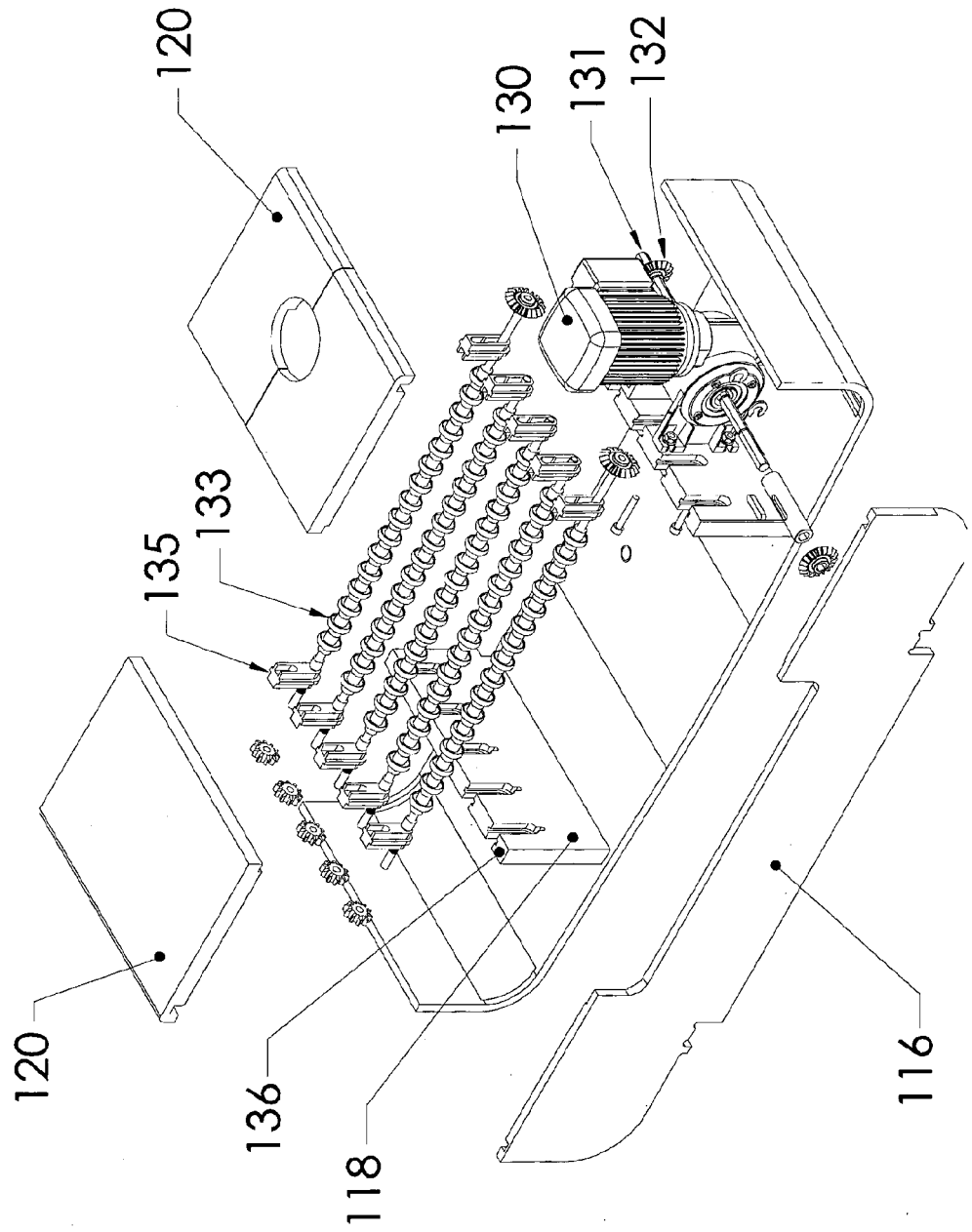
FIG. 11 is an exploded view of an infeed conveyor of the machine of FIG. 7.
Figure 12:
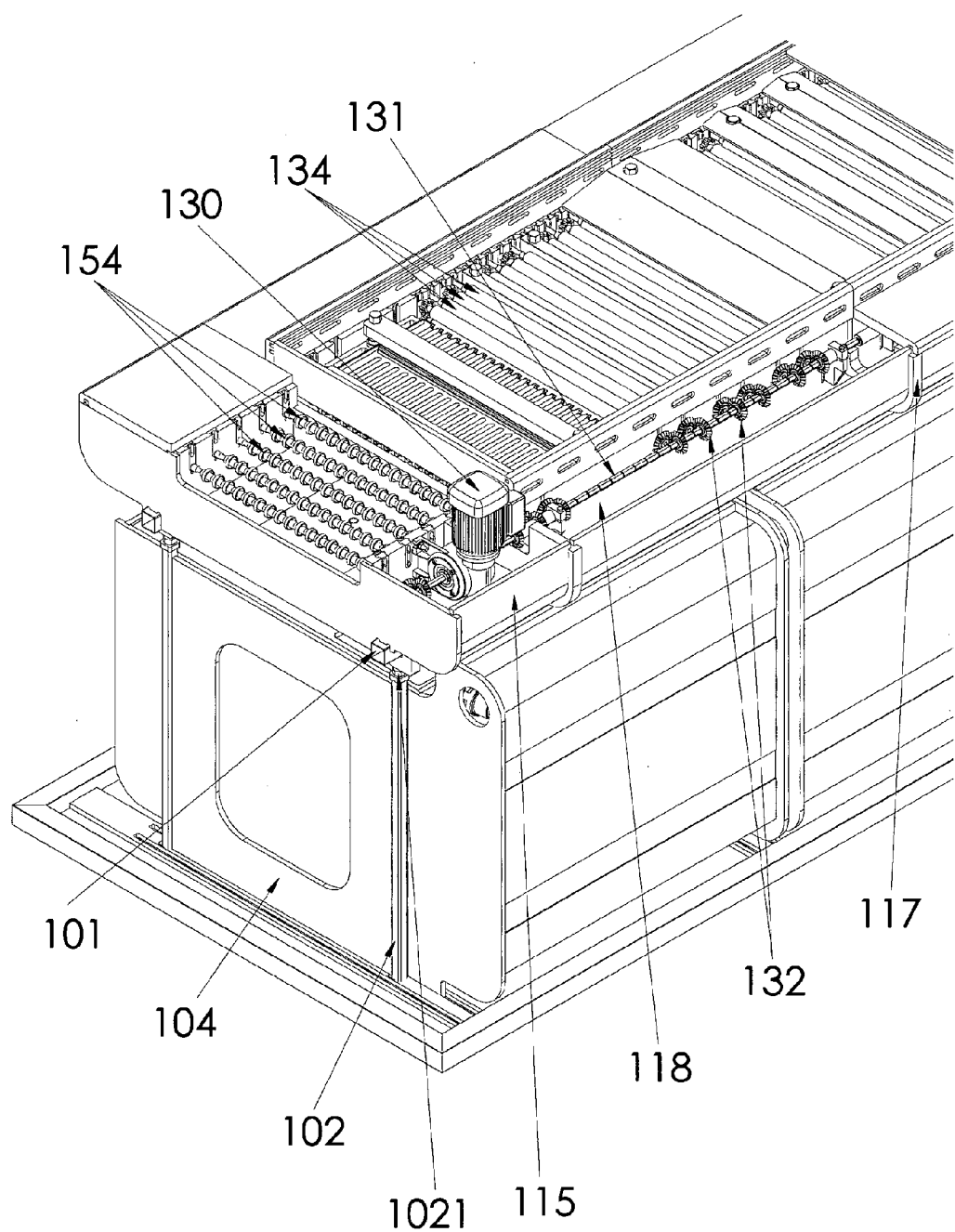
FIG. 12 is a view similar to that of FIG. 5 of the infeed conveyor and the first treatment bay.
Figure 13:
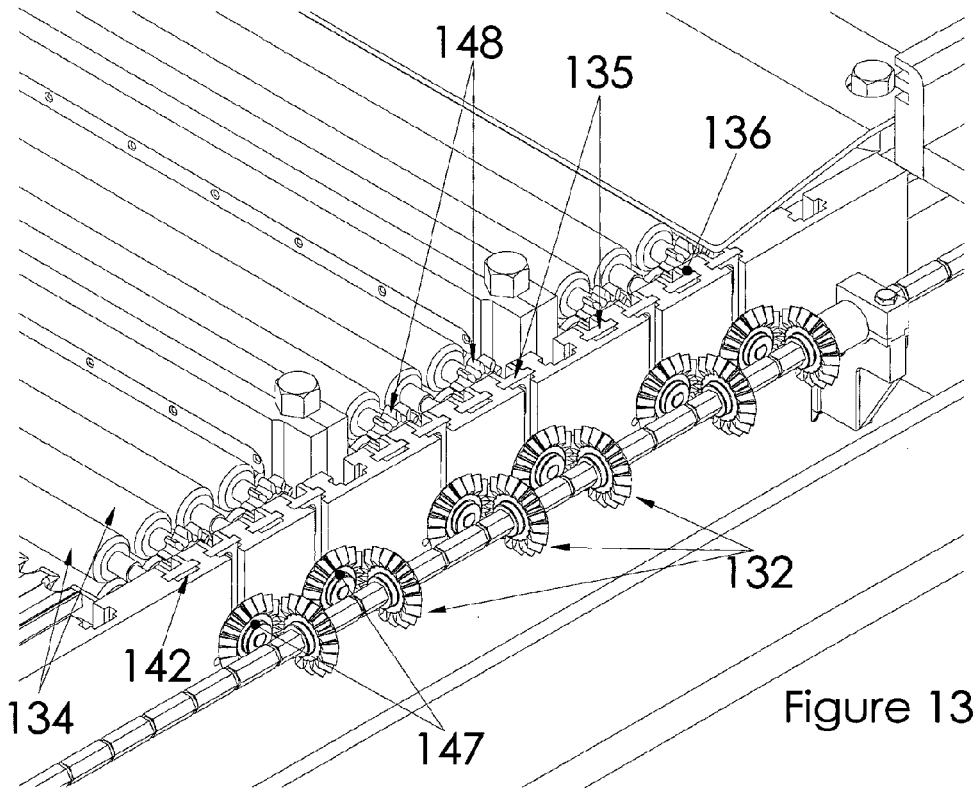
FIGS. 13 & 14 are detailed scrap views of the opposite ends of certain of the transport rollers of the machine.
Figure 14:
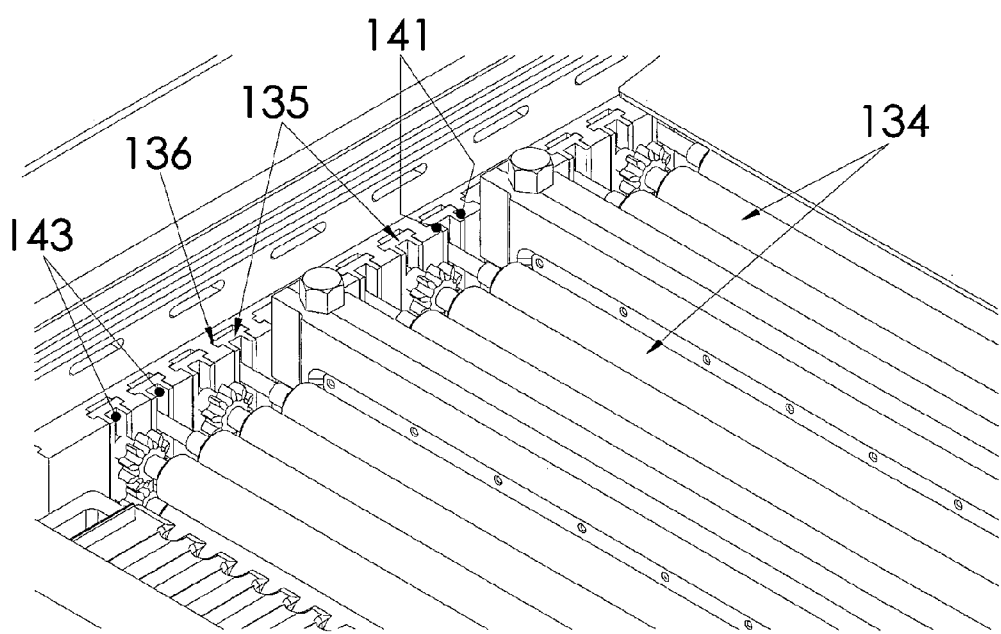
Figure 15:
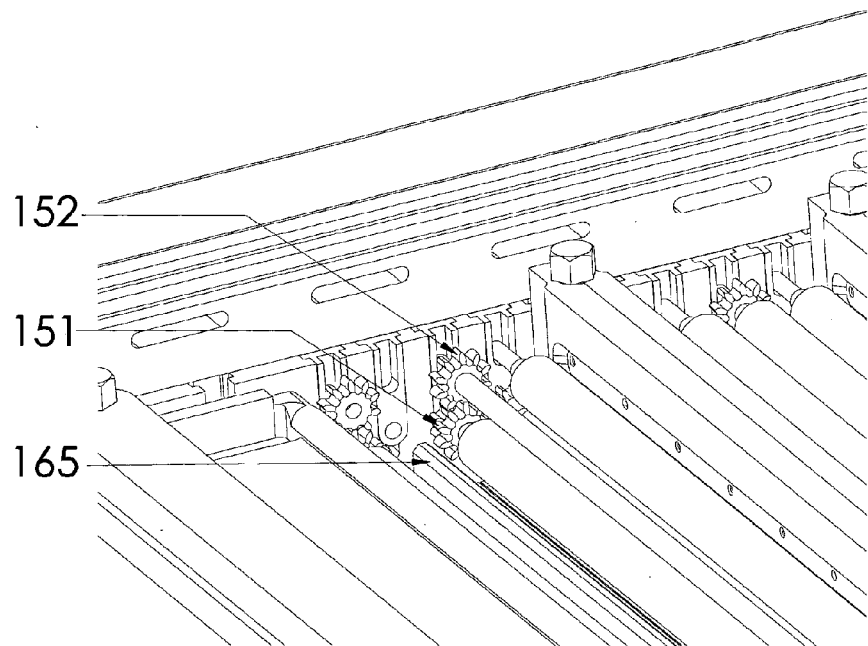
FIGS. 15, 16 & 17 are further detailed views from various angles of the drive pinions of the transport rollers, with certain of them removed for clarity.
Figure 16:
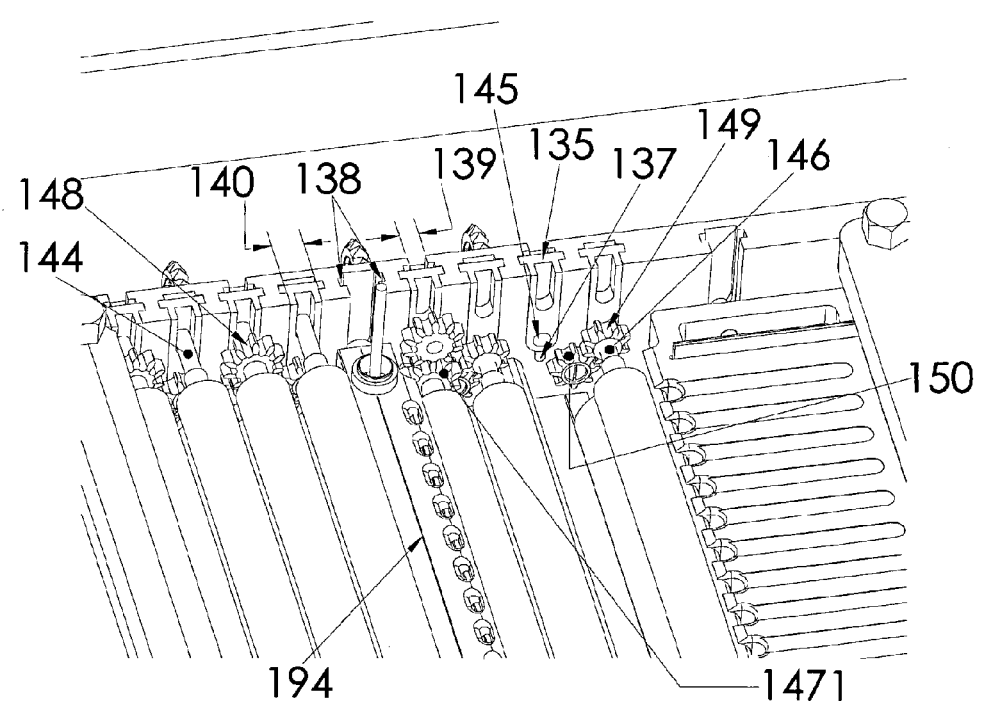
Figure 17:
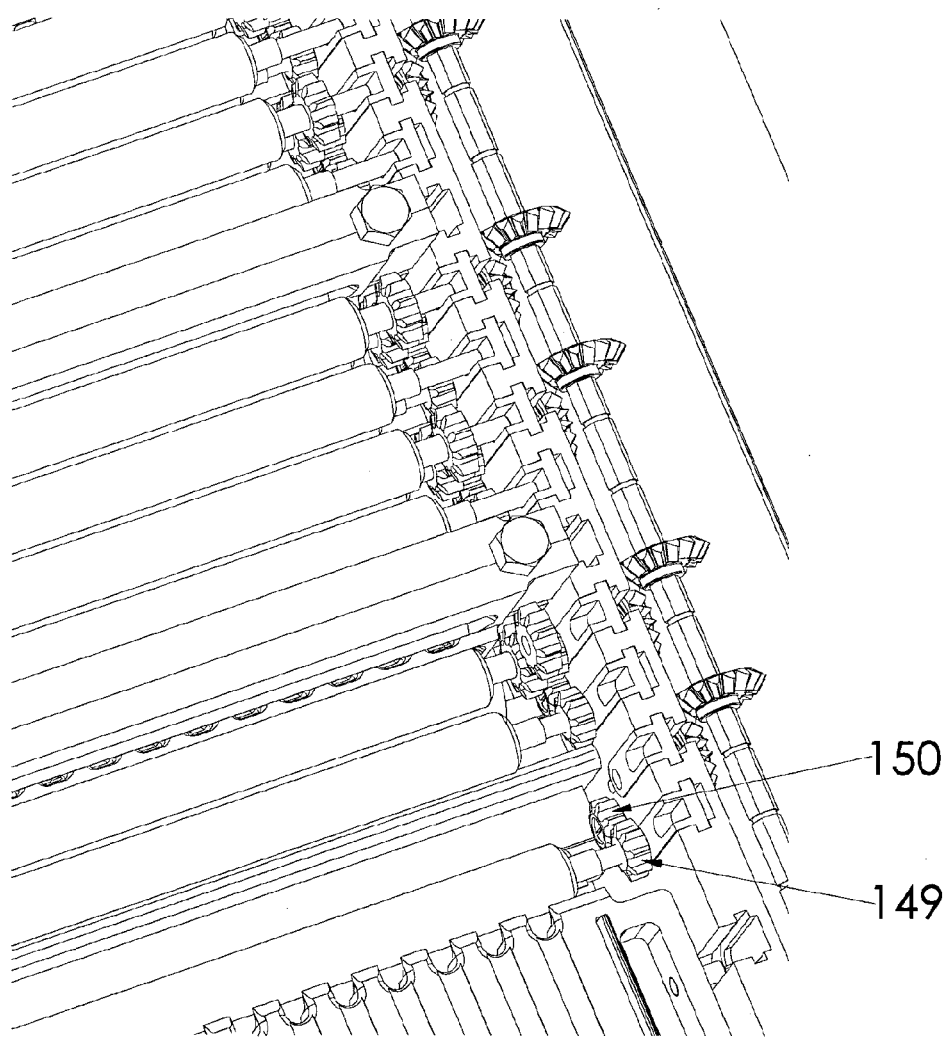
Figure 18:
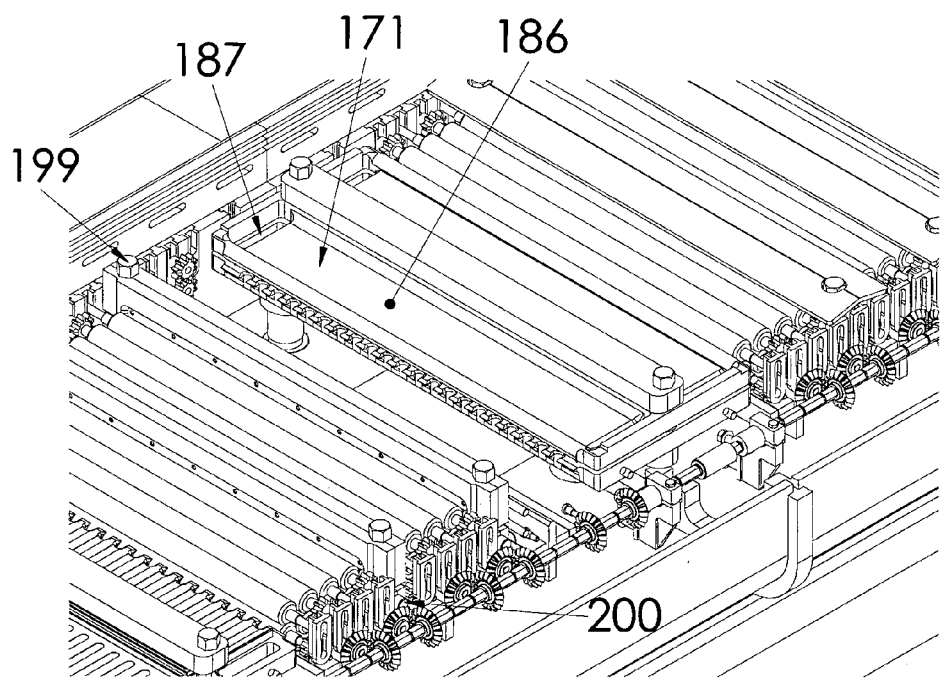
FIGS. 18 & 19 are similar views of the upper and lower plates of a main treatment head of the machine in accordance with the invention.
Figure 19:
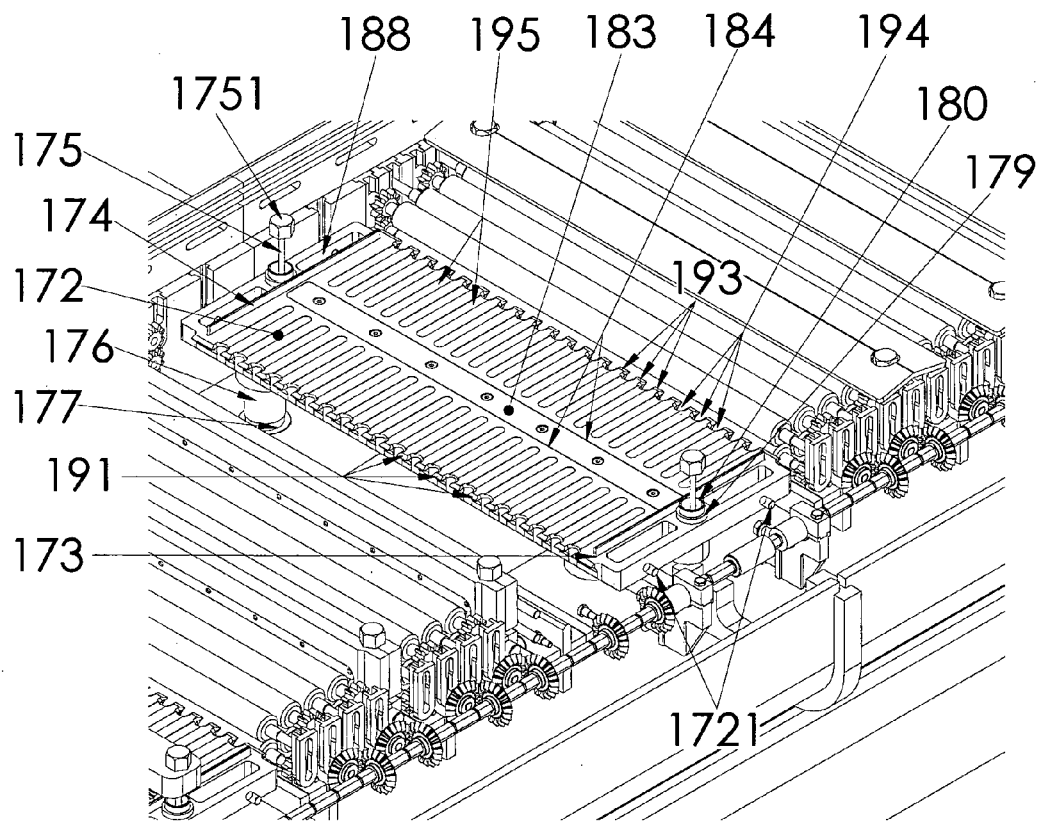
Figure 20:
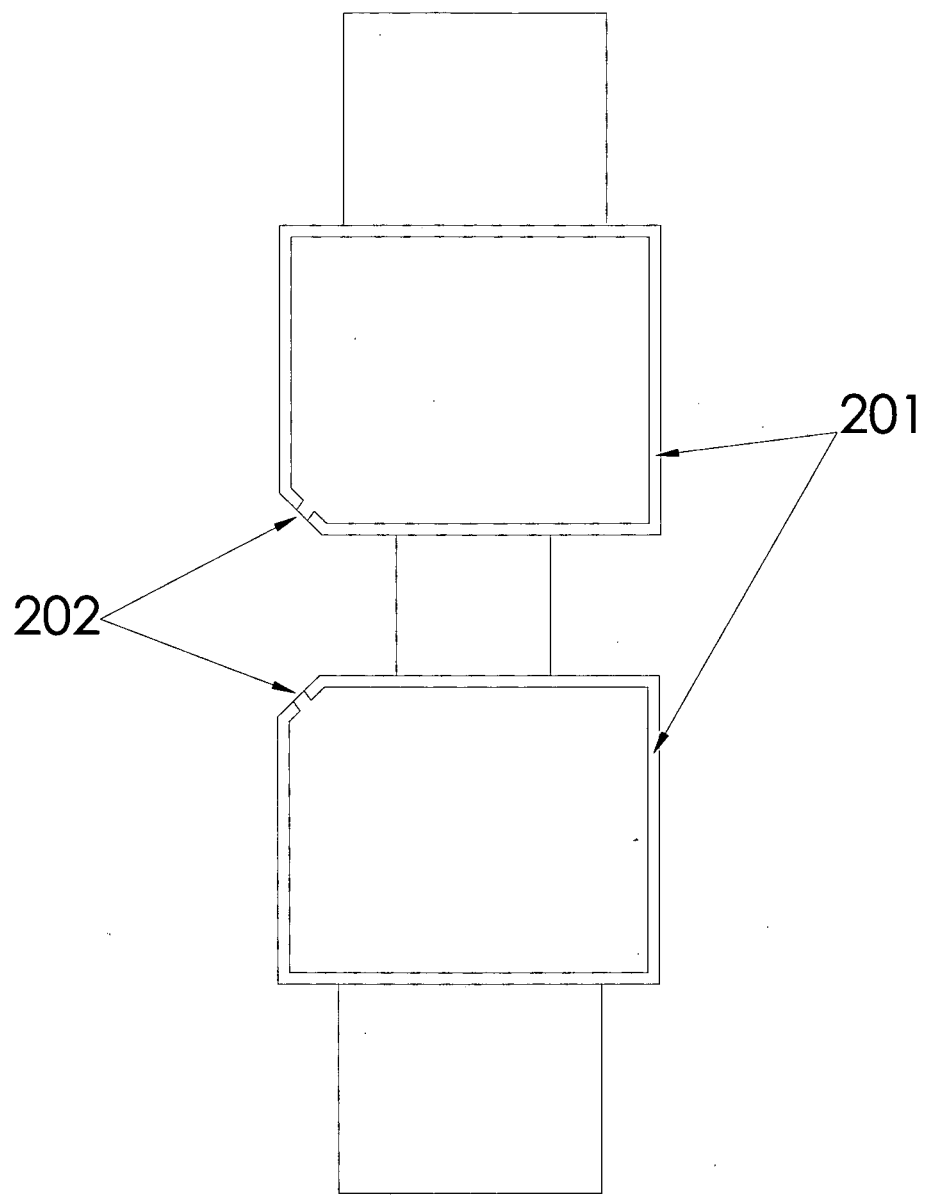
FIGS. 20 & 21 are cross-sectional views of alternative drying heads for the machine.
Figure 21:
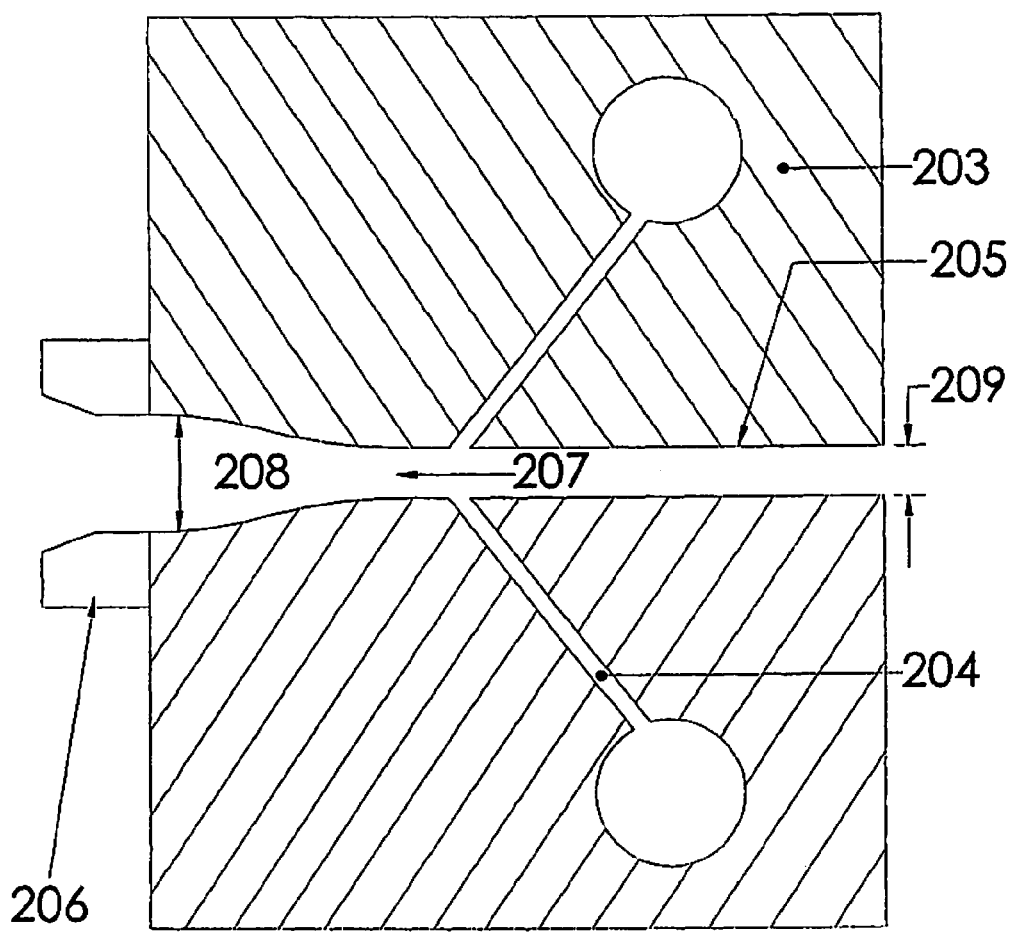

Immediately up- and down-stream of the primary treatment head, a pair of infeed and a pair of outfeed rollers are provided in its bay 196. The infeed rollers stabilise the board being fed into the treatment head and the out feed rollers draw it out, mechanically removing the bulk of the treatment liquid. As shown in FIG. 10, between primary treatment heads 160, three washing heads are provided with intervening transport rollers. The washing heads usually apply water to the boards and are simpler than the primary treatment heads, in that the board does not need to be between them for an appreciable length of time as is required for chemical reaction. They comprise square section stainless steel tubes or plastics material machined parts 197, having staggeredly opposed slits 198. The lower tubes have feed pipes extending down to supply ports in the floor of their bay. The upper and lower pipes are secured together by screw knobs 199 at apertures housing spacing sleeves. The ends of the tubes are plugged and provided with spigots 200 to engage in inner-wall grooves.

Further primary treatment heads can be provided up- and down-stream as required, for instance where, in a silver plating line, preliminary mild etching and post fixing is required. Other process steps may be degreasing in a bay with a head such as the washing head and lacquering which may require a shortened version of the primary treatment head to allow sufficient residence time for lacquer deposit.

Again, drying heads may be provided, having air knives. These are arranged in the manner of the washing tubes, but comprise either square stainless tubes 201 with a line of air nozzles 202 drilled in their opposed leading corners. Alternatively they can comprise machinings 203 of polypropylene having air knife slots 204. Whilst these can be directed at right angles to the board path in flat opposed faces 205 with lead in fingers 206, they are preferably directed upstream 207 of the board path movement, with greater space 208 between the machine faces on the upstream side than on the downstream side 209. This arrangement provides a low pressure area in the wide gap 208 for the vast majority of the drying air and a high pressure area in the narrow gap 209. With judicious positioning of the slots 204 close to the step between the gaps, flow towards the slots in the narrow gap can be induced.

Over each primary treatment head, a condensation shield 210 is provided. It comprises a flat central ridge 211 having down turned sloping edges 212, with extent in the direction of board feed to cover the process head. The ridge has apertures 213 for locating on the process head nuts 1751. The lower corners of the edges 212 rest on the inner walls. Thus condensate on the shield flows back into the relevant bay. To promote condensation, in view of the treatment liquid usually being hotter than ambient, the wall extensions on both sides of the machine have slots 215. Those on one side are open to ambient. Those on the other side are open to an evacuation duct 216. Thus air is drawn across the top of the condensation covers, the sliding covers 122 being closed. This promotes condensation and recycling of the reagent back into the bays.

The treatment liquid tanks 106 are modular, in that each within each tank bay 105 is discrete. The tanks generally have a number of partitions 231, according to the number of treatment heads they supply. Additionally they are provided with their own pumps, valves and plumbing 232. For connection to the treatment bays, flexible pipes are provided. Modular arrangement of the tanks, together with the load bearing legs 102 and chassis rails 101 allows the tanks to be withdrawn. For this they are provided with rails 233, which support also the legs. The rails have grooves 234 in which feet 235 of the tanks engage. Thus the tanks can readily be withdrawn for periodic cleaning. For normal use, the tanks are provided with front covers 236.

The machine is completed by infeed and outfeed conveyors 241,242, comprised of the rollers 133. The inner walls are closer together in these conveyors and the rollers are castellated.

The invention is not intended to be restricted to the details for the above described embodiment. Where space is at a premium and rigid boards are being processed, one pair of the infeed roller of each bay can be dispensed with.

The machine can be used for a variety of board treatment processes. For instance, it is particularly suitable for etching, where the treatment liquid in a main processing head is an etchant. This has particular advantage with respect to conventional etching baths where the etchant is moved only very slowly in order to avoid uneven etching between boards and within boards. The machine of the second embodiment has been found to provide even and complete etching across boards being processed in this way.

The invention claimed is:

1. An apparatus for the liquid treatment of sheet material passing through the apparatus, the apparatus comprising:
    upper path defining plate and lower path defining plate, the plates being separated by a gap between opposed faces of the plates to provide a treatment zone, the gap and the plates having:
        opposed faces of the plates,
        width transverse to a length of a generally horizontal sheet path between the plates,
        length along the sheet path from up-stream edges of the plates to their down-stream edges,
        at least one slot for treatment liquid injection in the opposed faces,
        a plenum chamber upstream on each plate upstream of at least one slot and
        opposed edge grooves in the opposed faces extending in a transport direction;
    the gap having edge closures of the gap, wherein the edge closures of the gap[s] are at least substantially along the length of the sheet path within the plates and delimiting the width of the gap, the edge closures of the gap being:
        edge strips let into the edge grooves, the edge strips and the edge grooves being sized to define the separation of the plates;
    means for transporting a sheet to and from the gap, in the transport direction giving sense to the terms up- and down-stream as used herein, and including:
        pairs of upper and lower in-feed and out-feed rollers at respective up- and down-stream edges of the plates;
    means for injecting treatment liquid to the gap intermediate its up- and down-stream ends for flow in the gap both up- and down-stream of the transport direction and including:
        at least one nozzle means in each of the plates at their opposed faces and
        means for pumping liquid to each of the nozzle means to fill the gap both up- and down-stream from at least one of the at least one slot to their up- and down-stream edges in normal use;
    wherein the treatment zone in the gap between the plates has:
        an up-stream portion up-stream of the nozzle means and
        a down-stream portion down-stream of the nozzle means, the two portions being substantially equal in their respective lengths from the upstream edge of the plates to the nozzle means and from the nozzle means to the downstream edge of the plates, whereby the liquid flows substantially equally to both edges and the sheet material is exposed to the liquid for treatment substantially equally in both portions; and
    wherein the treatment apparatus includes:
        rounded edges of the upper plate at its respective up- and down-stream ends, the rounding of the ends providing a smooth flow contour for liquid onto the top of the upper plate at its ends in the presence of sheet material between both the plates and either of the in-feed or out-feed rollers, the sheet material damming flow of liquid on top of the sheet material from passing between the lower roller and the lower plate; and
        a flow path from the top of the upper plate to a drain at edges of the plates.

2. Treatment apparatus as claimed in claim 1, wherein the nozzle means are transverse rows of bores in the plates.

3. Treatment apparatus as claimed in claim 1, wherein the nozzle means are transverse slots in the plates.

4. Treatment apparatus as claimed in claim 3, wherein a single transverse slot is provided in each upper path defining plate and lower path defining plate.

5. Treatment apparatus as claimed in claim 3, wherein two transverse slots are provided in each of the plates.

6. Treatment apparatus as claimed in claim 3, wherein the respective transverse slots in the upper path defining plate and lower path defining plate are exactly opposite each other.

7. Treatment apparatus as claimed in claim 3, wherein the respective transverse slots in the upper path defining plate and lower path defining plate are staggered from one plate to the other.

8. Treatment apparatus as claimed in claim 3, wherein the transverse slots are provided with a component of direction such that an up-stream one points up-stream and a down-stream one points downstream.

9. Treatment apparatus as claimed in claim 3, wherein the transverse slots are all directed normally to their plates.

10. Treatment apparatus as claimed in claim 3, wherein each transverse slot is provided as a machining from one side of the plates to the other.

11. Treatment apparatus as claimed in claim 5, wherein the transverse slots are provided by:
    transverse slot grooves in the opposed faces of the plates and
    strips let into the transverse slot grooves
the transverse slots being defined by up- and down-stream clearances between each strip and its transverse slot grooves.

12. Treatment apparatus as claimed in claim 11, wherein each strip is supported centrally to a piece of upper and lower plates remaining from formation of the transverse slot grooves in the plates.

13. Treatment apparatus as claimed in claim 12, including a flow passage to the transverse slots in the form of a series of drillings through the plates.

14. Treatment apparatus as claimed in claim 13, wherein each series of drillings comprises two lines of the drillings, one in communication with one of the clearances and the other in communication with the other of the clearances.

15. Treatment apparatus as claimed in claim 1, wherein the lower plate is castellated at edges opposite the pairs of upper and lower in-feed and out-feed rollers.

16. Treatment apparatus as claimed in claim 15, wherein the plates include runnels extending towards their slots from the castellations.

17. Treatment apparatus as claimed in claim 16, wherein the runnels taper outwards towards the castellations from their ends nearer the slots.

18. Treatment apparatus as claimed in claim 1, wherein the flow path to the drain includes edge slots in the plates outwards of the edge grooves.

19. Treatment apparatus as claimed in claim 1, wherein the upper path defining plate is thicker at its rounded edges than at its center, whereby liquid welling up over the edges is directed to flow sideways off the plates.

20. Treatment apparatus as claimed in claim 1, incorporated in a treatment machine having a pair of elevated chassis rails supported on legs, the treatment apparatus being carried on the chassis rails.

21. Treatment apparatus as claimed in claim 18, further comprising stiffening panels between a pair of respective legs at equivalent positions along chassis rails and close fitting liquid treatment tanks between the pair of respective legs spaced along the chassis rails, the panels and the tanks stabilising the pair of respective legs for support of the treatment apparatus.

22. Treatment apparatus as claimed in claim 18, including:
a plurality of U ribs extending between and supported on rails,
shells fixed to and extending between the ribs and
internal walls extending within the shells in lines from one rib to the next on opposite sides of the shells,
the upper path defining plate and lower path defining plate and the in- & out-feed rollers being supported on the internal walls.

23. Treatment apparatus as claimed in claim 20, including:
a drive shaft extending on the outside of one line of internal walls,
driving bevel gears mounted at spaced positions along the shaft,
driven bevel gears in mesh with the driving gears and carried on shafts extending through the internal walls for bearing support and drive of a respective one of each of the pairs of feed rollers and
means for driving the drive shaft.

24. Treatment apparatus as claimed in claim 21, including:
upright slots passing through an inner wall at the positions of the feed rollers,
bearing supports for the feed rollers engaged in the upright slots, the bearing supports having:
through bores for support of lower ones of the feed rollers driven by the bevel gears and
inner side, upright extending slots for location of shafts of upper ones of the feed rollers.

25. Treatment apparatus as claimed in claim 22, including additional guide rollers parallel to the feed rollers and driven therefrom.

26. Treatment apparatus as claimed in claim 18, including duplicated:
upper path defining plates and lower path defining plates,
edge closures,
transport means,
treatment liquid injection means,
all as per claim 1, together with transverse dividers between the upper path defining plate and lower path defining plates and the transport means.

27. Treatment apparatus as claimed in claim 18, including other stations up- and/or down-stream of at least one treatment station, the other stations being washing stations and/or drying stations and/or degreasing stations and/or lacquering stations, the other stations each having their own pairs of upper and lower in-feed and out-feed rollers.

28. Treatment apparatus as claimed in claim 25, wherein a washing station is comprised of upper and lower tubes spaced above and below the sheet path and having staggeredly opposed slits and means for supplying washing liquid into the tubes.

29. Treatment apparatus as claimed in claim 25, wherein a drying station is comprised of upper and lower tubes spaced above and below the sheet path and having a series of drillings.

30. Treatment apparatus as claimed in claim 29, wherein the drillings face upstream and the upper and lower tubes are stepped at the drillings to provide a step, having a bigger gap between them upstream of the step than downstream.

31. Treatment apparatus as claimed in claim 18, wherein a treatment station has a condensation shield arranged over at least the upper path defining plate to allow condensation of treatment liquid and its return to a station's drain.

32. Treatment apparatus as claimed in claim 18, including:
upper extensions of an internal wall,
covers extending between the upper extensions and
apertures in the upper extensions for passage of ventilation over at least one station within the covers.

33. Treatment apparatus as claimed in claim 18, wherein the lower in-feed rollers of a treatment station and of at least one washing station, where provided, has a liquid removal wiper wiping against its underside.

* * * * *